US006903673B1

(12) United States Patent
Lin

(10) Patent No.: US 6,903,673 B1
(45) Date of Patent: Jun. 7, 2005

(54) ANALOG-TO-DIGITAL CONVERTING MODULE CAPABLE OF CONVERTING DATA AT AN INCREASED RESOLUTION

(75) Inventor: Chi-Cheng Lin, Tao-Yuan (TW)

(73) Assignee: BenQ Corporation, Tao-Yuan Hsien (TW)

(*) Notice: Subject to any disclaimer, the term of this patent is extended or adjusted under 35 U.S.C. 154(b) by 0 days.

(21) Appl. No.: 10/707,512

(22) Filed: Dec. 19, 2003

(51) Int. Cl.[7] .................................................. H03M 1/12
(52) U.S. Cl. ...................................... 341/155; 345/173
(58) Field of Search ................................ 341/155, 156, 341/160, 159, 161; 345/173

(56) References Cited

U.S. PATENT DOCUMENTS 5,889,511 A * 3/1999 Ong et al. ................... 345/173
5,973,632 A * 10/1999 Tai ............................. 341/156
6,011,503 A * 1/2000 Lee ............................ 341/159
6,411,241 B1 * 6/2002 Taketoshi .................... 341/155
6,583,661 B1 * 6/2003 Tanji et al. ................... 327/355

* cited by examiner

Primary Examiner—Peguy JeanPierre
(74) Attorney, Agent, or Firm—Winston Hsu

(57) ABSTRACT

A converting module for converting a first analog voltage into a digital output value includes a comparator for comparing the first analog voltage with a threshold voltage and generating a comparison result, the threshold voltage corresponding to a first group of digits containing at least one digit. A subtracting circuit generates a second analog voltage by subtracting the threshold voltage from the first analog voltage if the comparison result indicates that the first analog voltage is greater than or equal to the threshold voltage. An analog-to-digital converter converts the second analog voltage into a second group of digits and concatenates the first group of digits and the second group of digits to form the digital output value.

9 Claims, 3 Drawing Sheets

ANALOG-TO-DIGITAL CONVERTING MODULE CAPABLE OF CONVERTING DATA AT AN INCREASED RESOLUTION

BACKGROUND OF INVENTION

1. Field of the Invention

The present invention relates to an analog-to-digital converter, and more specifically, to an analog-to-digital converting module with an adjustable saturation point.

2. Description of the Prior Art

Analog-to-digital converters are widely used in industry for converting analog input voltages into digital output voltages. Analog-to-digital converters are utilized in applications input devices such as pointing devices. Pointing devices are commonly used in conjunction with computers to control the movement of graphical cursers or pointers on display screens and to select objects and operate controls displayed on the screen. Recently, small laptop and notebook computers have become very popular. Laptop and notebook computers may be used in conjunction with a docking station so that a standard keyboard, mouse, and CRT display may be used for the user interface. However, laptop and notebook computers are designed to be used while traveling away from the office or home. In such remote locations, the user does not always have available a flat surface upon which to use a mouse. Accordingly, laptop and notebook computers typically have a built-in pointing device, such as a touchpad.

A touchpad comprises a rectangular surface that is mapped to correspond to a display screen. By touching the location on the touchpad, the user causes the computer to move the pointer to the corresponding location on the screen. Since a typical touchpad is substantially smaller than the screen, accurate positioning of the pointer can be difficult. In order to be useable, a touchpad must be large enough to permit the user to position the pointer accurately. The large size of touchpads makes them relatively expensive.

Please refer to FIG. 1. FIG. 1 is a diagram of a touchpad input system 10 according to the prior art. The touchpad input system 10 contains a touchpad 20 capable of sensing position of a point on the surface of the touchpad 20. The touchpad 20 includes resistors 22 and 24 for generating voltage values according to position of the point on the surface of the touchpad 20. A voltage Vp is applied to each of the resistors 22 and 24, with the other end of the resistors 22 and 24 being connected to ground. The position of the point with respect to each of the resistors 22 and 24 generates voltages Vx and Vy, respectively. The values of the voltages Vx and Vy are directly related to a position of the point on the touchpad 20. In FIG. 1, the point contacts the touchpad 20 at point $(x_1, y_1)$. The touchpad input system 10 includes a switch 30 for alternatively selecting either an x-axis or a y-axis for measuring a position of the point. A controller 60 outputs a control signal SW_CNT for controlling the switch 30 to sequentially read the analog voltages Vx and Vy generated by the resistors 22 and 24, respectively. A buffer 40 is electrically connected to the switch 30 for impedance matching and for reducing a loading effect in the touchpad input system 10. The voltage value read from the touchpad 20 is stored in the buffer 40. An analog-to-digital converter 50 reads the analog voltage value from the buffer 40, and converts the analog voltage into a digital voltage value. The controller 60 then reads the digital voltage from the from the analog-to-digital converter 50, and position of the point on the touchpad 20 is determined.

The touchpad input system 10 shown in FIG. 1 is a common structure used extensively as an input device for electronics. The resolution of the touchpad 20 is limited by the resolution of the analog-to-digital converter 50. For example, suppose that the analog-to-digital converter 50 has an 8-bit resolution. The touchpad 20 can then have a resolution of 256×256. Increasing the resolution of the touchpad 20 is usually accomplished through the use of a high-resolution analog-to-digital converter. Unfortunately, high costs of high-resolution analog-to-digital converters limit the extent to which the resolution of the touchpad 20 can be increased.

SUMMARY OF INVENTION

It is therefore an objective of the claimed invention to provide a converting module with an adjustable saturation point. The converting module can be used in applications such as a touchpad for increasing the resolution of the touchpad.

According to the claimed invention, a converting module for converting a first analog voltage into a digital output value includes a comparator for comparing the first analog voltage with a threshold voltage and generating a comparison result, the threshold voltage corresponding to a first group of digits containing at least one digit. A subtracting circuit generates a second analog voltage by subtracting the threshold voltage from the first analog voltage if the comparison result indicates that the first analog voltage is greater than or equal to the threshold voltage. An analog-to-digital converter converts the second analog voltage into a second group of digits and concatenates the first group of digits and the second group of digits to form the digital output value.

It is an advantage of the claimed invention that the subtracting circuit subtracts the threshold voltage from the first analog voltage if the first analog voltage is greater than or equal to the threshold voltage for allowing the converting module to attain higher resolution without increasing the resolution of the analog-to-digital converter.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 1:
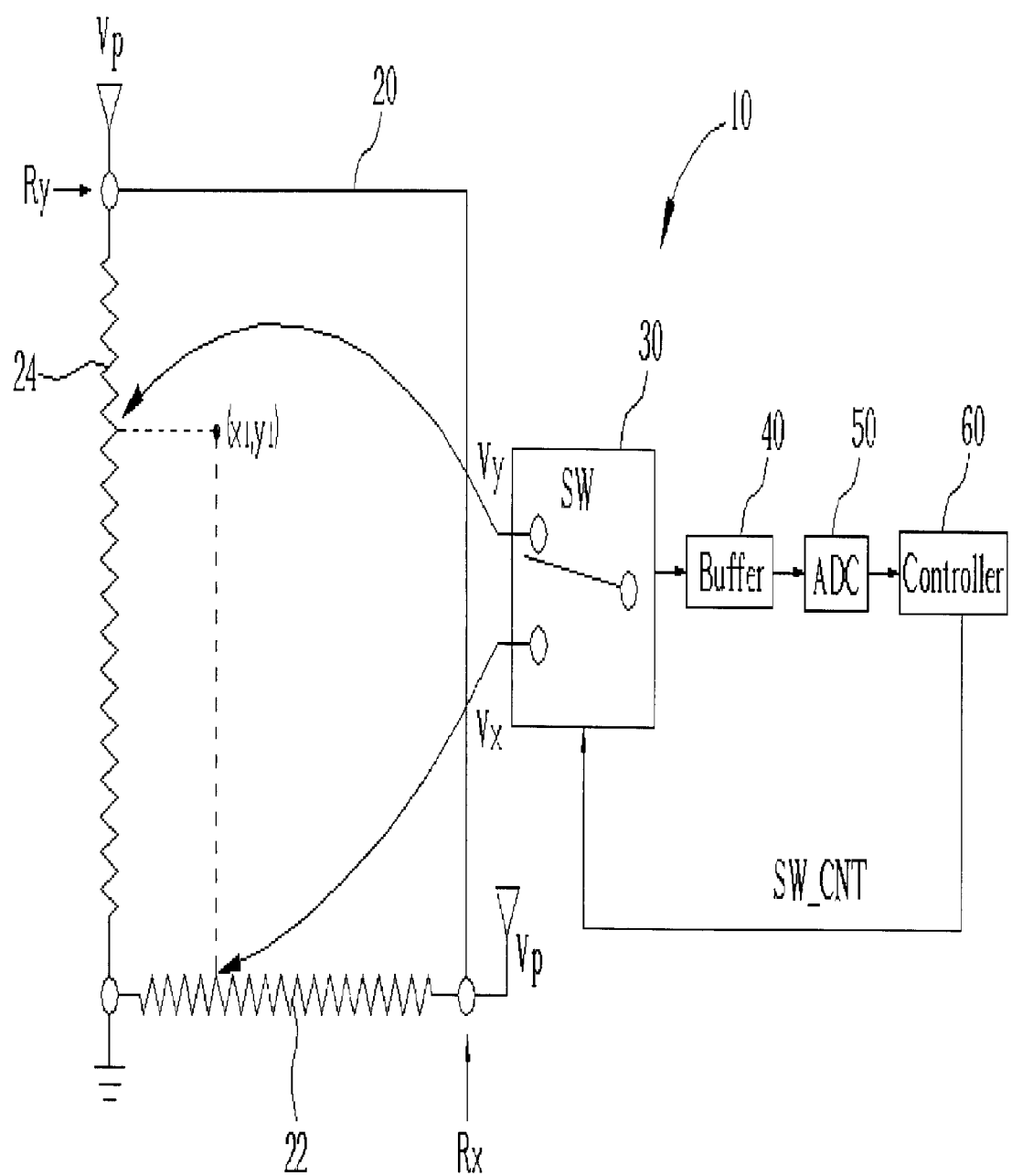
FIG. 1 is a diagram of a touchpad input system according to the prior art.
Figure 2:
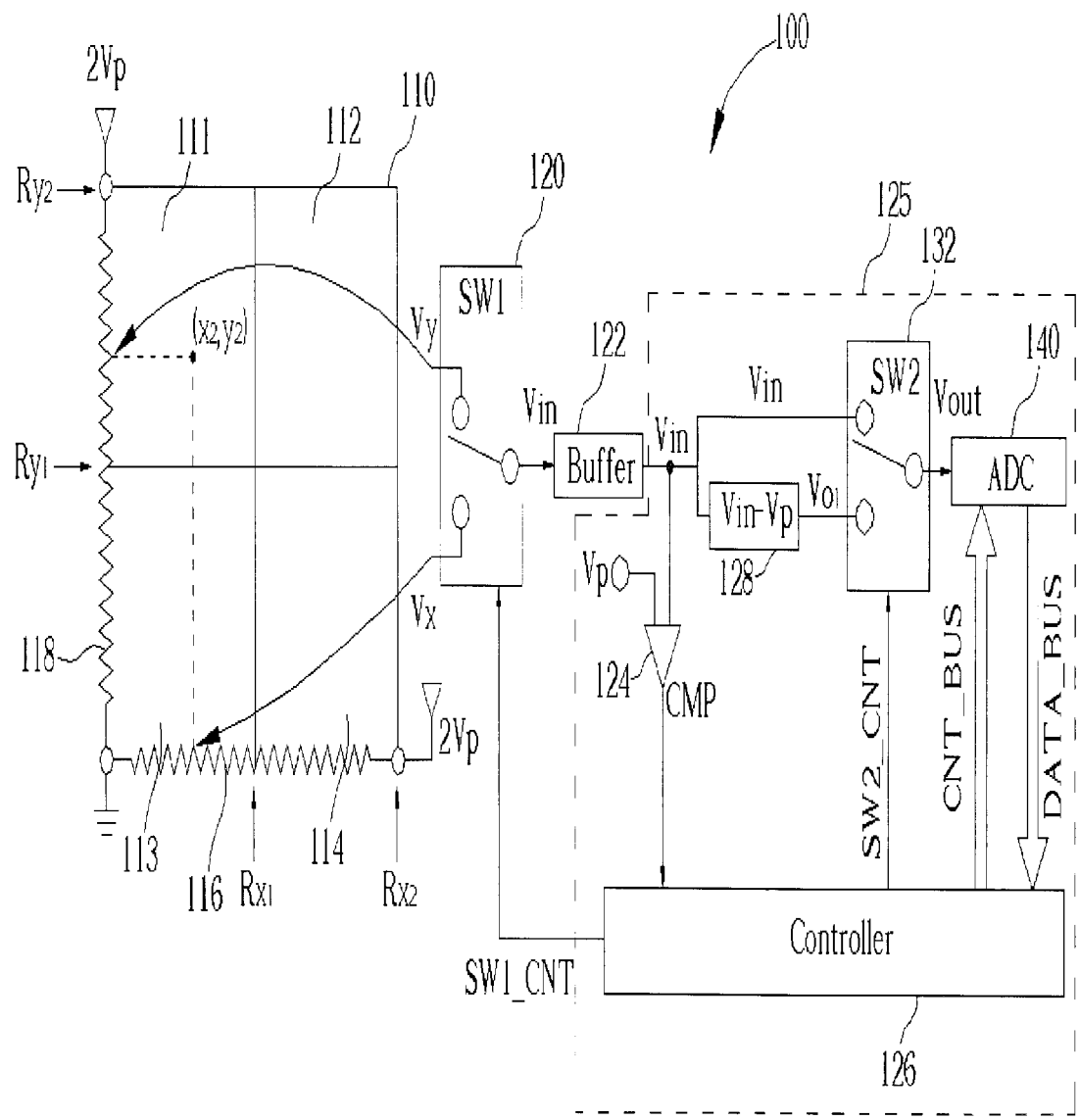
FIG. 2 is a diagram of a touchpad input system utilizing a converting module according to the present invention.

Please refer to FIG. 2. FIG. 2 is a diagram of a touchpad input system 100 utilizing a converting module 125 according to the present invention. The touchpad input system 100 contains a touchpad 110 capable of sensing position of a point on the surface of the touchpad 110. The touchpad 110 includes resistors 116 and 118 for generating voltage values according to position of the point on the surface of the touchpad 110. A voltage 2Vp is applied to each of the resistors 116 and 118, with the other end of the resistors 116 and 118 being connected to ground. The position of the point with respect to each of the resistors 116 and 118 generates voltages Vx and Vy, respectively. The values of the voltages Vx and Vy are directly related to a position of the point on the touchpad 110.

The touchpad 110 is divided into a plurality of regions 111–114. Although only four regions 111–114 are shown in FIG. 2, the touchpad 110 can also be divided into other numbers of regions. The number of regions is preferably a perfect square, such as 4, 9, 16, or so on. As will be explained below, each of the regions 111–114 in the present invention touchpad 110 has the same resolution as the entire touchpad 20 of the prior art. In order for this to be possible, the voltage 2Vp provided to resistors 116 and 118 in the present invention is higher than the voltage Vp provided to resistors 22 and 24 in the prior art. Take resistor 116 as an example. The voltage value 2Vp is applied to end $Rx_2$ of resistor 116. Since the other end of resistor 116 is grounded, a midpoint $Rx_1$ of the resistor 116 would have a voltage value of Vp. Therefore, the voltage measured across the resistor 116 between points $Rx_2$ and $Rx_1$ is equal to Vp, which is the same voltage measured across the resistor 116 between point $Rx_1$ and ground. As shown in FIG. 2, the section of resistor 116 between points $Rx_2$ and $Rx_1$ corresponds to regions 112 and 114 of the touchpad 110, while the section of resistor 116 between point $Rx_1$ and ground corresponds to regions 111 and 113 of the touchpad 110. Resistor 118 has a structure identical to that of resistor 116. That is, a section of resistor 118 between points $Ry_2$ and $Ry_1$ corresponds to regions 111 and 112 of the touchpad 110, while a section of resistor 118 between point $Ry_1$ and ground corresponds to regions 113 and 114 of the touchpad 110.

In FIG. 2, the point contacts the touchpad 110 at point ($x_2$, $y_2$). The touchpad input system 100 includes a first switch 120 for alternatively selecting either an x-axis or a y-axis for measuring a position of the point. A controller 126 of the converting module 125 is used to issue a control signal SW1_CNT to control the first switch 120 to sequentially read the analog voltages Vx and Vy generated by the resistors 116 and 118, respectively. A buffer 122 is electrically connected to the first switch 120 for impedance matching and for reducing a loading effect in the touchpad input system 100. Depending on the region of the touchpad 110 contacted by the point, the voltage value Vin can have a value between 0 and 2Vp. Since an analog-to-digital converter 140 of the converting module 125, which is used to convert the analog voltage Vin into a digital voltage value, can only handle voltages in the range of 0 to Vp, the voltage value Vin must first be altered to match input requirements of the analog-to-digital converter 140.

When the voltage value Vin is between Vp and 2Vp, a subtracting circuit 128 of the converting module 125 is used to subtract a voltage value of Vp from the voltage Vin. Output from the subtracting circuit 128 is labeled as voltage $Vo_1$, and is equal to the difference Vin-Vp.

In order to decide if the output voltage $Vo_1$ from the subtracting circuit 128 or the voltage Vin is to be selected for conversion with the analog-to-digital converter 140, the converting module 125 contains a comparator 124 for comparing the voltage value Vin to the voltage Vp. A result CMP of this comparison is then sent to the controller 126, which uses control signal SW2_CNT to operate a second switch 132 accordingly. When the comparison result CMP indicates that Vin is less than Vp, the voltage Vin is selected as an output value Vout of the second switch 132. On the other hand, when the comparison result CMP indicates that Vin is greater than or equal to Vp, the voltage $Vo_1$ is selected as the output value Vout of the second switch 132. Once the voltage value Vout has been selected with the second switch 132, the analog-to-digital converter 140 converts the analog voltage value Vout into a digital voltage value. The controller 126 controls operation of the analog-to-digital converter 140 with a control bus CNT_BUS, and the digital result outputted by the analog-to-digital converter 140 is sent to the controller 126 through a data bus DATA_BUS.

Figure 3:
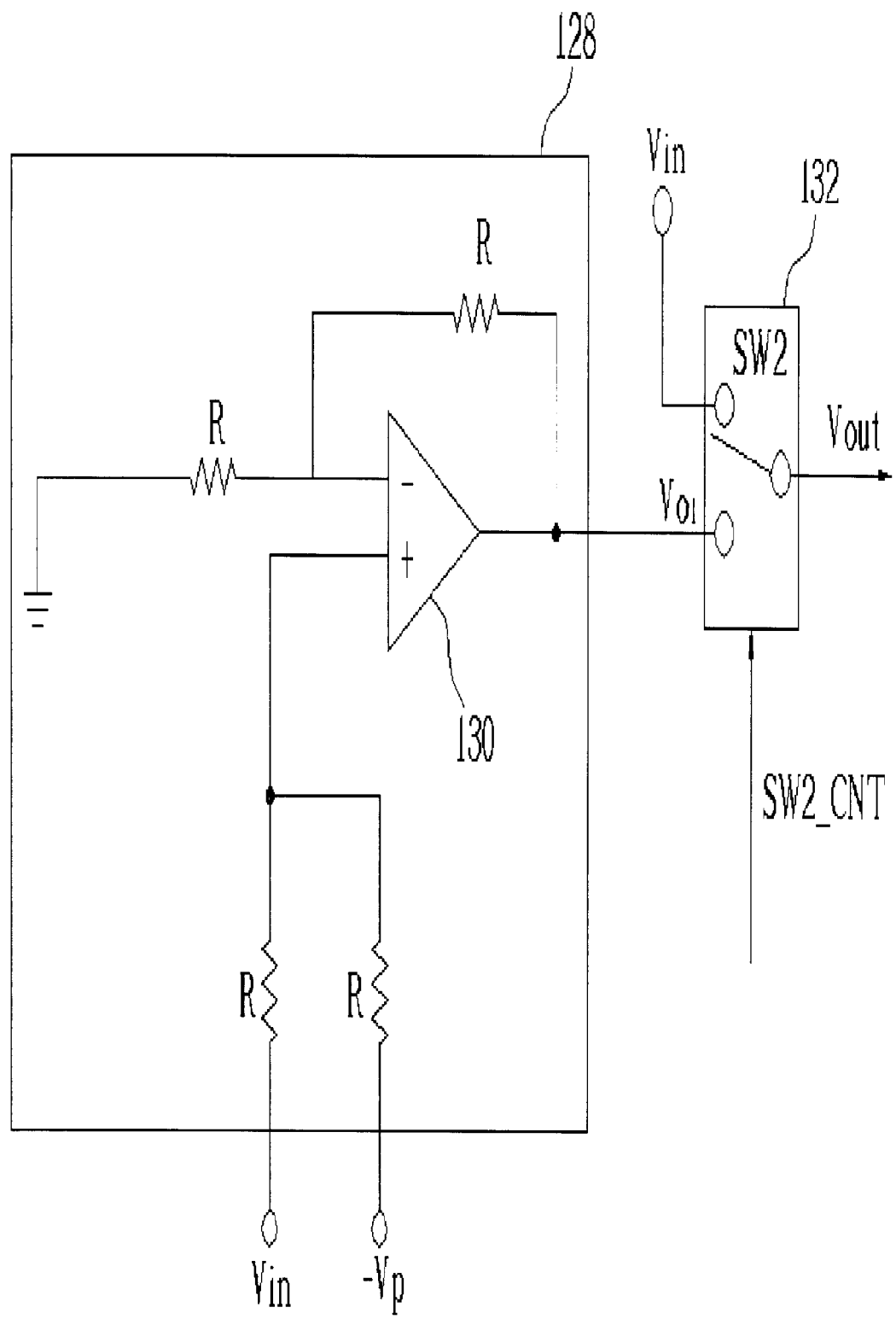
FIG. 3 is a detailed diagram of a subtracting circuit for choosing an output voltage that is sent to an analog-to-digital converter.

Please refer to FIG. 3. FIG. 3 is a detailed diagram of the subtracting circuit 128 used in conjunction with the second switch 132 for choosing the output voltage Vout that is sent to the analog-to-digital converter 140. The subtracting circuit 128 shown in FIG. 3 is provided as an example only, and by no means is used to limit the scope of the present invention. The subtracting circuit 128 contains an operational amplifier 130 serving as a summing amplifier. The operational amplifier 130 receives inputs Vin and Vp, and outputs the difference Vin-Vp as the voltage value $Vo_1$. Then the second switch 132 selects either the voltage Vin or the voltage $Vo_1$ according to the control signal SW2_CNT output from the controller 126.

Based on the comparison result CMP given by the comparator 124, the controller 126 is able to determine if the voltage Vin was originally above Vp or not. This allows the controller 126 to determine which region 111–114 of the touchpad 110 that the point is in located in. The present invention touchpad input system 100 uses the full resolution of the analog-to-digital converter 140 to convert analog voltage values into digital voltage values indicating position of the point in each region 111–114 of the touchpad 110. Therefore, the more regions that the touchpad 110 is segmented into, the higher the overall resolution of the touchpad 110.

If the voltage Vin was above Vp, then the controller 126 will set a first group of binary digits to correspond to the value of Vp. On the other hand, if the voltage Vin was below Vp, then the first group of binary digits will be set equal to zero. The first group of binary digits contains at least one binary digit. The analog-to-digital converter 140 will then convert the voltage value Vout into a second group of binary digits. To form the final digital output result, the analog-to-digital converter 140 will concatenate the first group of binary digits with the second group of binary digits.

As an example, suppose that the analog-to-digital converter 140 has a resolution of 8 bits. That means the analog-to-digital converter 140 can generate digital output values from 0 to 255. A digital representation of Vp would have a corresponding digital value of 256. Therefore, if the value of Vin was greater than the value of Vp, Vp would be subtracted from Vin to form Vout. The voltage Vout would then be converted into an 8-bit digital value, and the digital value would be concatenated with a leading digit of "1" to form the digital output value. In this example, the present invention effectively adds one bit of resolution to the touchpad 110. In general, if the analog-to-digital converter 140 has a resolution of n bits, the touchpad 110 will have a resolution of n+1 bits, assuming the touchpad 110 is divided into four regions 111–114. If the touchpad 110 is divided into a greater number of regions, then the resolution of the touchpad 110 can be increased further using the spirit of the present invention.

The prior art touchpad 20 had a resolution of 256×256 when used with the analog-to-digital converter 50 having a resolution of 8 bits. If the analog-to-digital converter 140 of the present invention also has a resolution of 8 bits, each of the regions 111–114 will also have a resolution of 256×256. Thus, the total resolution of the touchpad 110 will be 512×512. The increase in resolution is accomplished without increasing the resolution of the analog-to-digital converter 140, thereby eliminating the need for an expensive high-resolution analog-to-digital converter.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of operating a converting module, the method comprising:
   receiving an analog voltage;
   comparing the analog voltage to a threshold voltage with a comparator and generating a comparison result, the threshold voltage being equal to a saturation voltage of the comparator;
   subtracting the threshold voltage from the analog voltage if the comparison result indicates that the analog voltage is greater than or equal to the threshold voltage; and
   converting the analog voltage into a digital output voltage.

2. A touchpad for detecting location of a point in contact with a surface of the touchpad, comprising:
   a touch input transducer for converting the location of the point into analog transduced voltages proportional to a distance of the point from peripheral sides of the surface of the touchpad, wherein the surface of the touchpad is divided into at least four regions, and each region is associated with a unique range of analog transduced voltages produced by the touch input transducer; and
   a converting module for converting the analog transduced voltages into a set of digital codes representing the location of the point upon the surface of the touchpad, the converting module comprising:
      a comparator for comparing each analog transduced voltage with a threshold voltage and generating a comparison result;
      a subtracting circuit for subtracting the threshold voltage from each analog transduced voltage if the comparison result indicates that the analog transduced voltage is greater than or equal to the threshold voltage; and
      an analog-to-digital converter for converting the analog transduced voltage into a digital output voltage.

3. The touchpad of claim 2 wherein the converting module further comprises a controller for controlling the subtracting circuit according to the comparison result generated by the comparator and for controlling operation of the analog-to-digital converter.

4. The touchpad of claim 2 wherein the touch input transducer comprises:
   a first resistor disposed along a first direction of the touchpad, the first resistor being divided into at least fist and second sections; and
   a second resistor disposed along a second direction of the touchpad, the second resistor being divided into at least third and fourth sections, wherein the first direction is perpendicular to the second direction.

5. The touchpad of claim 4 wherein when the point is located in a region corresponding to the first section of the first resistor, the analog transduced voltage is less than the threshold voltage, and when the point is located in a region corresponding to the second section of the first resistor, the analog transduced voltage is greater than or equal to the threshold voltage.

6. The touchpad of claim 4 wherein when the point is located in a region corresponding to the third section of the second resistor, the analog transduced voltage is less than the threshold voltage, and when the point is located in a region corresponding to the fourth section of the second resistor, the analog transduced voltage is greater than or equal to the threshold voltage.

7. The touchpad of claim 4 wherein a linear resolution of the touchpad corresponding to each of the first and second sections of the first resistor and the third and fourth sections of the second resistor is equal to a resolution of the analog-to-digital converter.

8. A converting module for converting a first analog voltage into a digital output value, comprising:
   a comparator for comparing the first analog voltage with a threshold voltage and generating a comparison result, the threshold voltage corresponding to a first group of digits containing at least one digit, and the threshold voltage being equal to a saturation voltage of the comparator;
   a subtracting circuit generating a second analog voltage by subtracting the threshold voltage from the first analog voltage if the comparison result indicates that the first analog voltage is eater than or equal to the threshold voltage; and
   an analog-to-digital converter for converting the second analog voltage into a second group of digits, and concatenating the first group of digits and the second group of digits to form the digital output value.

9. The converting module of claim 8 further comprising a controller for controlling the subtracting circuit according to the comparison result generated by the comparator and for controlling operation of the analog-to-digital converter.

* * * * *